(12) United States Patent
Bae et al.

(10) Patent No.: US 9,806,100 B2
(45) Date of Patent: Oct. 31, 2017

(54) MANUFACTURING METHOD OF THIN FILM TRANSISTOR ARRAY PANEL AND THIN FILM TRANSISTOR ARRAY PANEL

(71) Applicant: SAMSUNG DISPLAY CO., LTD., Yongin-si, Gyeonggi-do (KR)

(72) Inventors: Joon-Hwa Bae, Suwon-si (KR); Jong Chan Lee, Suwon-si (KR); Woong Hee Jeong, Seoul (KR); In Sun Hwang, Suwon-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/140,725

(22) Filed: Apr. 28, 2016

(65) Prior Publication Data

US 2017/0104015 A1 Apr. 13, 2017

(30) Foreign Application Priority Data

Oct. 7, 2015 (KR) .................. 10-2015-0141228

(51) Int. Cl.
*H01L 27/12* (2006.01)
*H01L 29/04* (2006.01)
*H01L 29/16* (2006.01)

(52) U.S. Cl.
CPC ........ *H01L 27/1229* (2013.01); *H01L 27/124* (2013.01); *H01L 27/1274* (2013.01); *H01L 29/04* (2013.01); *H01L 29/1604* (2013.01)

(58) Field of Classification Search
CPC ............. H01L 27/3244; H01L 27/1214; H01L 27/3262; H01L 27/3248; H01L 27/1222; H01L 29/4908; H01L 21/02686; H01L 21/02592; H01L 27/1229; H01L 27/1274; H01L 29/1604; H01L 29/04; H01L 27/124
See application file for complete search history.

(56) References Cited

U.S. PATENT DOCUMENTS

| 5,773,327 A | 6/1998 | Yamazaki et al. |
| 2014/0138695 A1* | 5/2014 | Tian .................. H01L 29/66757 257/72 |

FOREIGN PATENT DOCUMENTS

| KR | 1020000003569 | 1/2000 |
| KR | 1020060008524 | 1/2006 |
| KR | 1020090083288 | 8/2009 |
| KR | 101132404 | 3/2012 |

\* cited by examiner

*Primary Examiner* — Roy Potter
(74) *Attorney, Agent, or Firm* — F. Chau & Associates, LLC

(57) ABSTRACT

A manufacturing method of a thin film transistor array panel according to an exemplary embodiment of the present invention includes forming an amorphous silicon thin film on a substrate. A lower region of the amorphous silicon thin film is crystallized to form a polycrystalline silicon thin film by irradiating a laser beam with an energy density of from about 150 mj/cm$^2$ to about 250 mj/cm$^2$ to the amorphous silicon thin film.

19 Claims, 21 Drawing Sheets

|  | Normal PA | VLDD PA |
|---|---|---|
| Ion (A) (@20V) | 5.5E-4 | 3.8E-4 |
| Ioff (A) (@MIN) | 6.13E-11 | 3.47E-12 |

MANUFACTURING METHOD OF THIN FILM TRANSISTOR ARRAY PANEL AND THIN FILM TRANSISTOR ARRAY PANEL

CROSS-REFERENCE TO RELATED APPLICATION

This application claims priority under 35 U.S.C. §119 to Korean Patent Application No. 10-2015-0141228 filed in the Korean Intellectual Property Office on Oct. 7, 2015, the disclosure of which is incorporated by reference herein in its entirety.

(A) TECHNICAL FIELD

Exemplary embodiments of the present invention relate to a manufacturing method of a thin film transistor array panel, and more particularly to a thin film transistor array panel.

(B) DISCUSSION OF RELATED ART

In liquid crystal displays (LCDs), amorphous silicon thin film transistors (a-Si TFTs) have been employed as switching elements. As high resolution displays are developed, polycrystalline silicon thin film transistors (poly-Si TFTs) having a relatively quick operational speed may be employed.

Methods for forming a polycrystalline silicon thin film in a polycrystalline silicon thin film transistor may include a method of forming the polycrystalline silicon thin film directly on a substrate, and a method of forming an amorphous silicon thin film on a substrate and then heat-treating the amorphous silicon thin film to form a polycrystalline silicon thin film.

Since a glass substrate used in LCDs may be deformed under a heat treatment process at 600° C. or more, an excimer laser may be used to heat-treat the amorphous silicon thin film. In the heat treatment method using the excimer laser (e.g., excimer laser annealing; ELA), a high-energy laser beam may be irradiated to the amorphous silicon thin film such that the amorphous silicon thin film may be substantially instantaneously heated for tens of nanoseconds (ns) to be crystallized, thus preventing the glass substrate from being damaged.

SUMMARY

Exemplary embodiments of the present invention may provide a manufacturing method of a thin film transistor array panel with a simplified manufacturing process, and a thin film transistor array panel of reducing or eliminating a leakage current.

A manufacturing method of a thin film transistor array panel according to an exemplary embodiment of the present invention includes forming an amorphous silicon thin film on a substrate. A lower region of the amorphous silicon thin film is crystallized to form a polycrystalline silicon thin film by irradiating a laser beam with an energy density of from about 150 mj/cm$^2$ to about 250 mj/cm$^2$ to the amorphous silicon thin film.

A thickness of the amorphous silicon thin film may be from about 35 nm to about 55 nm.

A thickness of the crystallized polycrystalline silicon thin film may be from about 25 nm to about 35 nm.

A thickness of an uncrystallized part of the amorphous silicon thin film may be from about 10 nm to about 20 nm after crystallizing the lower region of the amorphous silicon thin film to form the polycrystalline silicon thin film.

A ratio of the thickness of the polycrystalline silicon thin film to the thickness of the uncrystallized amorphous silicon thin film may be about 2:1.

The laser beam may be irradiated to an upper region of the amorphous silicon thin film.

The manufacturing method may include forming a gate insulating layer on the substrate before forming the amorphous silicon thin film on the substrate.

The manufacturing method may include forming source and drain electrodes on the amorphous silicon thin film.

The manufacturing method may include forming a gate line including a gate electrode on the substrate before forming the gate insulating layer.

A thin film transistor array panel according to an exemplary embodiment of the present invention includes a gate insulating layer formed on a substrate. A polycrystalline silicon thin film is formed on the gate insulating layer. An amorphous silicon thin film is formed on the polycrystalline silicon thin film. Source and drain electrodes are formed on the amorphous silicon thin film. Protrusions and depressions are formed on an interface between the polycrystalline silicon thin film and the amorphous silicon thin film.

A ratio of a thickness of the polycrystalline silicon thin film to a thickness of the amorphous silicon thin film may be about 2:1.

A thickness of the polycrystalline silicon thin film may be from about 25 nm to about 35 nm.

A thickness of the amorphous silicon thin film may be from about 10 nm to about 20 nm.

The thin film transistor array panel may include an n+ silicon thin film formed between the amorphous silicon thin film and the source and drain electrodes.

The thin film transistor array panel may include a pixel electrode connected to the drain electrode.

In a manufacturing method of a thin film transistor array panel according to an exemplary embodiment of the present invention, manufacturing costs may be reduced by simplifying the manufacturing process, and a leakage current may be reduced or eliminated by the thin film transistor array panel according to an exemplary embodiment of the present invention.

BRIEF DESCRIPTION OF THE DRAWINGS

The above and other features of the inventive concept will become more apparent by describing in detail exemplary embodiments thereof, with reference to the accompanying, in which:

FIGS. 20 and 21 show exemplary results of TFT characteristics of the thin film transistor according to the comparative example and a thin film transistor according to an exemplary embodiment of the present invention.

DETAILED DESCRIPTION OF THE EMBODIMENTS

Figure 1:
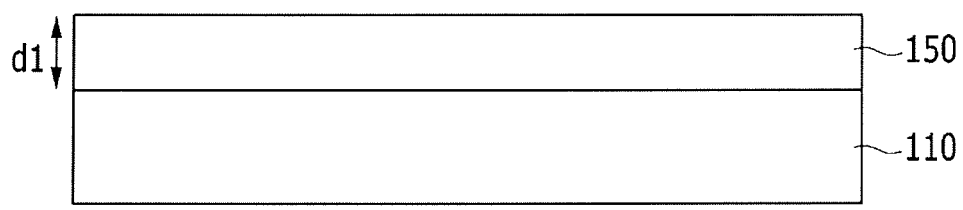
FIG. 1 illustrates a manufacturing method of a silicon thin film according to an exemplary embodiment of the present invention.
Figure 1:
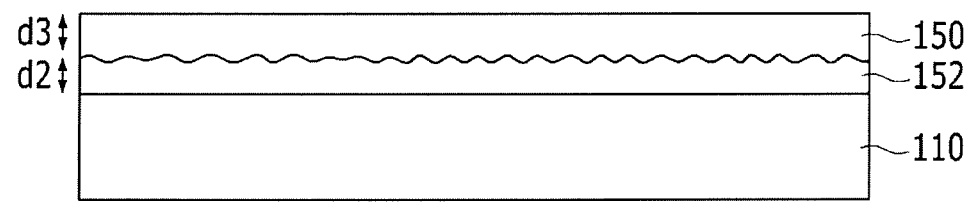

Exemplary embodiments of the present invention will be described in more detail below with reference to the accompanying drawings, in which exemplary embodiments of the present invention are shown. As those skilled in the art would realize, the described embodiments may be modified in various different ways, all without departing from the spirit or scope of the present invention.

In the drawings, the thickness of layers, films, panels, or regions may be exaggerated for clarity. Like reference numerals may refer to like elements throughout the specification and drawings. It will be understood that when an element such as a layer, film, region, or substrate is referred to as being "on" another element, it may be directly on the other element or intervening elements may be present.

A manufacturing method of a thin film transistor array panel and a thin film transistor array panel according to exemplary embodiments of the present invention will now be described in more detail below with reference to the accompanying drawings.

FIG. 1 illustrates a manufacturing method of a silicon thin film according to an exemplary embodiment of the present invention. Referring to FIG. 1, a manufacturing method of a silicon thin film may include forming an amorphous silicon thin film 150 on a substrate 110, and crystallizing a lower region of the amorphous silicon thin film 150 into a polycrystalline silicon thin film 152 by irradiating a laser beam 700. The laser beam 700 may include light having an energy density of from about 150 mj/cm$^2$ to about 250 mj/cm$^2$ to the amorphous silicon thin film 150.

Referring to FIG. 1 (A), the amorphous silicon thin film 150 may be formed on the substrate 110. The amorphous silicon thin film 150 may have a thickness d1 of from about 35 nm to about 55 nm.

Referring to FIG. 1 (B), light having the energy density of from about 150 mj/cm$^2$ to about 250 mj/cm$^2$ may be irradiated to a top surface of the amorphous silicon thin film 150. The irradiated light may cause the amorphous silicon to be melted and crystallized from a lower part of the substrate 110, thus forming the polycrystalline silicon thin film 152.

The extent to which the amorphous silicon thin film 150 is transformed into the polycrystalline silicon thin film 152 may be controlled by the energy density of the irradiated light. In an exemplary embodiment of the present invention, a thickness d2 of the polycrystalline silicon thin film 152 may be from about 25 nm to about 35 nm. A thickness d3 of the residual amorphous silicon thin film 150 may be from about 10 nm to about 20 nm.

The laser beam 700 may be intermittently irradiated to the substrate. The laser beam 700 may be emitted by an excimer laser, which generates a laser beam with a relatively short wavelength, at relatively high power, and relatively high efficiency. The excimer laser may include, for example, an inert gas, an inert gas halide, a mercury halide, an inert gas acid compound, and a polyatomic excimer. Examples of the inert gas are $Ar_2$, $Kr_2$, and $Xe_2$. Examples of the inert gas halide are ArF, ArCl, KrF, KrCl, XeF, and XeCl. Examples of the mercury halide are HgCl, HgBr, and HgI. Examples of the inert gas acid compound are ArO, KrO, and XeO. Examples of the polyatomic excimer are $Kr_2F$, and $Xe_2F$.

The laser irradiation may cause the amorphous silicon thin film 150 to be partially melted and crystallized, thus forming the polycrystalline silicon thin film 152. The laser beam irradiated to the amorphous silicon thin film 150 according to an exemplary embodiment of the present invention may have relatively low energy density of from about 150 mj/cm$^2$ to about 250 mj/cm$^2$. Thus, substantially the entire amorphous silicon thin film 150 may be melted and crystallized to form the polycrystalline silicon thin film 152, or only some of the amorphous silicon thin film 150 may be crystallized to form the polycrystalline silicon thin film 152. A ratio of the thickness d2 of the polycrystalline silicon thin film 152 to the thickness d3 of the amorphous silicon thin film 150 may be about 2:1.

Figure 2:
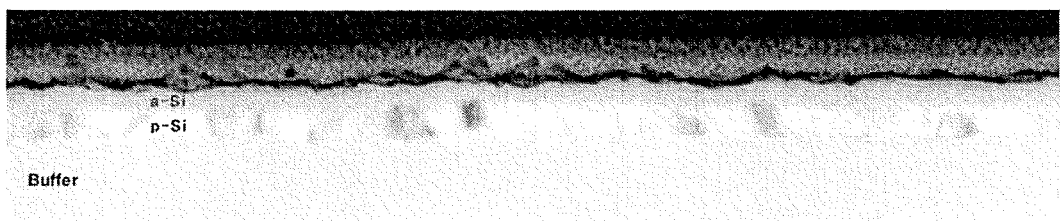
FIGS. 2 and 3 are TEM images of a silicon thin film manufactured in accordance with the manufacturing method of the silicon thin film according to an exemplary embodiment of the present invention.
Figure 3:
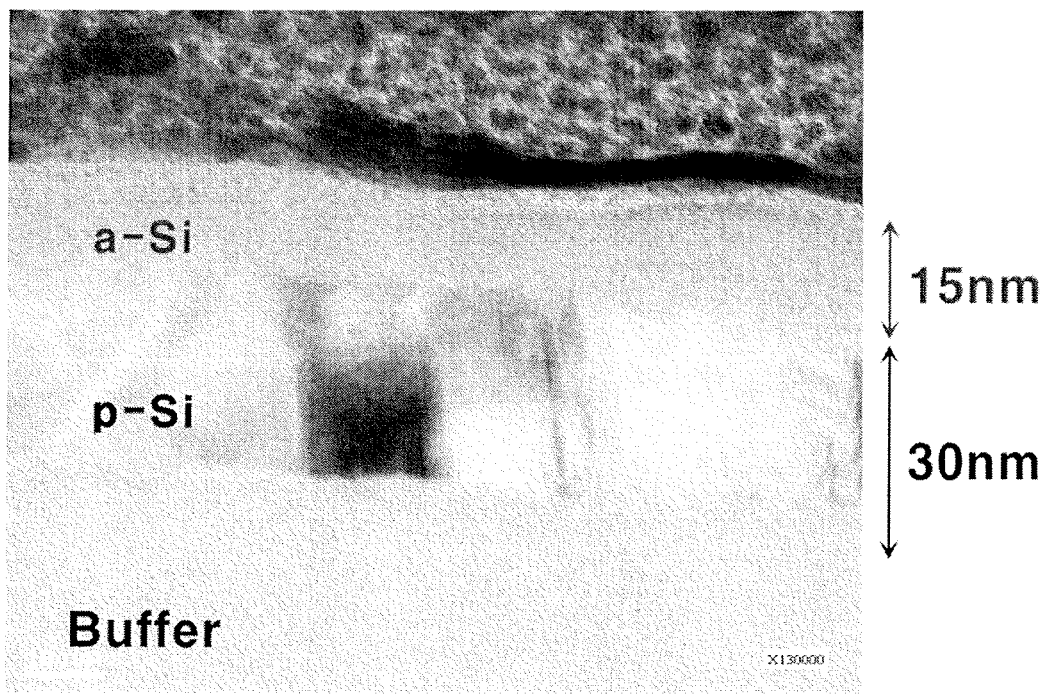

Some of the amorphous silicon thin film 150 may be crystallized to form the polycrystalline silicon thin film 152 by the relatively low energy irradiation. Thus, even without an additional deposition process of the amorphous silicon thin film 150, the silicon thin film can be manufactured to have a multi-layered structure in which the amorphous silicon thin film 150 is formed on the polycrystalline silicon thin film 152. FIGS. 2 and 3 are TEM images of a silicon thin film manufactured in accordance with the manufacturing method of the silicon thin film according to an exemplary embodiment of the present invention. Referring to FIG. 2, an amorphous silicon thin film (a-Si) may be formed on a polycrystalline silicon thin film (p-Si).

FIG. 3 is a partial enlarged image of FIG. 2. Referring to FIG. 3, the thickness of the polycrystalline silicon thin film p-Si is about 30 nm and the thickness of the amorphous silicon thin film a-Si is about 15 nm.

The amorphous silicon thin film a-Si may be partially melted and crystallized to form the polycrystalline silicon thin film P-Si, and thus an interface between the polycrystalline silicon thin film and the amorphous silicon thin film might not be smooth.

When a polycrystalline silicon thin film is formed and an amorphous silicon thin film is then deposited to increase interface adherence between the polycrystalline silicon thin film and the amorphous silicon thin film, a top surface of the polycrystalline silicon thin film may be processed to be relatively smooth using $H_2$ plasma and the amorphous silicon thin film may then be deposited on the polycrystalline silicon thin film.

In the manufacturing method of the silicon thin film according to an exemplary embodiment of the present invention, since the amorphous silicon thin film a-Si may be partially melted and crystallized to form the polycrystalline silicon thin film p-Si, an additional surface treatment may be omitted. Thus, the interface between the amorphous silicon thin film a-Si and the polycrystalline silicon thin film p-Si might not be smooth and thus may have a plurality of protrusions and depressions. However, despite the protrusions and depressions, since the amorphous silicon thin film a-Si is not deposited via an additional process, there might not be any problem in the interface adherence.

Thus, the silicon thin film having a dual structure including the polycrystalline silicon thin film p-Si and the amorphous silicon thin film a-Si may be used as an active region of the thin film transistor. Since the amorphous silicon thin film a-Si may be formed on the polycrystalline silicon thin film p-Si, a leakage current may be reduced or prevented.

Figure 4:
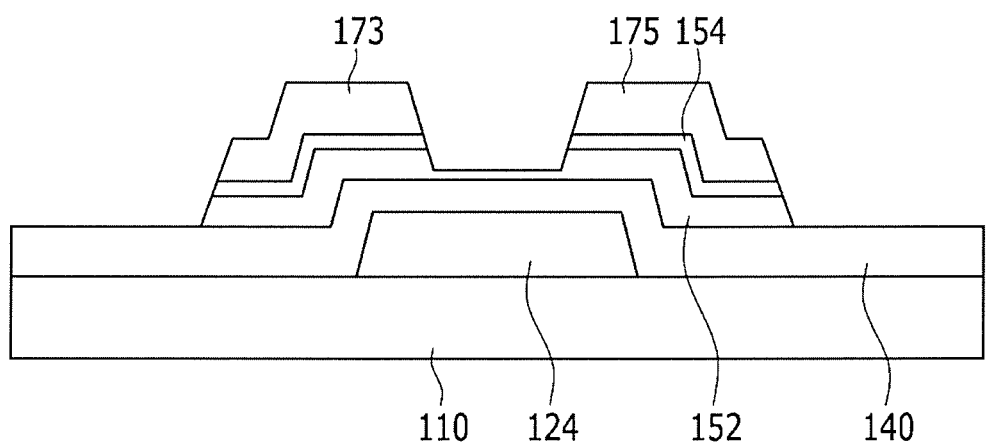
FIG. 4 illustrates a thin film transistor according to a comparative example in which an amorphous silicon thin film is omitted.
Figure 5:
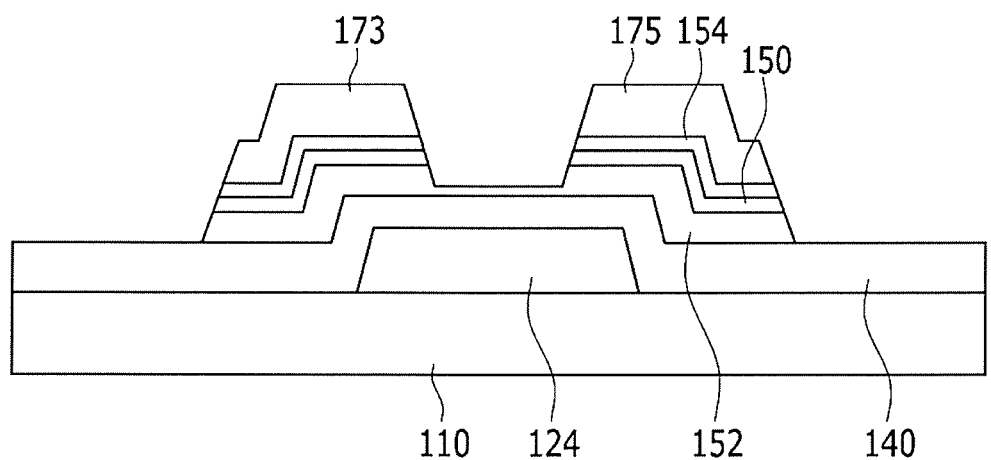
FIG. 5 illustrates a thin film transistor according to an exemplary embodiment of the present invention in which an amorphous silicon thin film is formed.

FIG. 4 illustrates a thin film transistor according to a comparative example in which an amorphous silicon thin film is omitted. FIG. 5 illustrates a thin film transistor according to an exemplary embodiment of the present invention in which an amorphous silicon thin film is formed.

Referring to FIG. 4, a gate electrode 124 may be formed on the substrate 110, and a gate insulating layer 140 may be formed on the gate electrode 124. The polycrystalline silicon thin film 152 may be formed on the gate insulating layer 140, and an n+ silicon thin film 154 may be formed on the polycrystalline silicon thin film 152.

A source electrode 173 and a drain electrode 175 may be formed on the n+ silicon thin film 154, and the polycrystalline silicon thin film 152 exposed between the source and drain electrodes 173 and 175 may function as a semiconductor layer.

FIG. 5 has substantially the same structure as FIG. 4, but the amorphous silicon thin film 150 may be formed on the polycrystalline silicon thin film 152, and the n+ silicon thin film 154 is formed on the amorphous silicon thin film 150. Thus, a leakage current from a thin film transistor including the polycrystalline silicon thin film 152, the n+ silicon thin film 154 and the amorphous silicon thin film 150 may be reduced or eliminated. A method of forming the thin film transistor will be described in more detail below.

Figure 6:
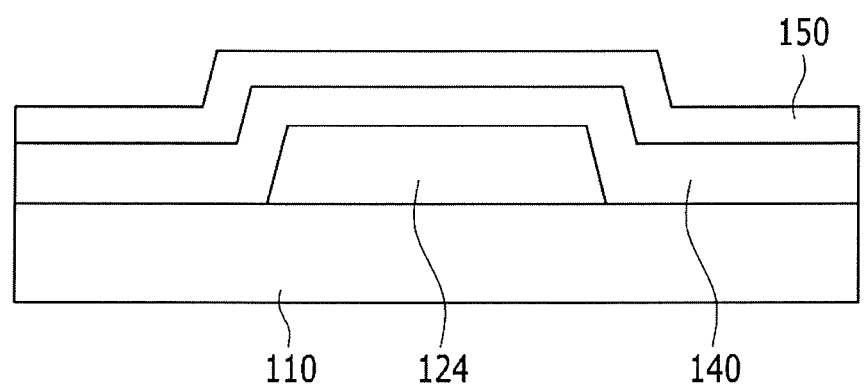
FIGS. 6 to 8 illustrate a manufacturing method of a thin film transistor according to the comparative example.
Figure 7:
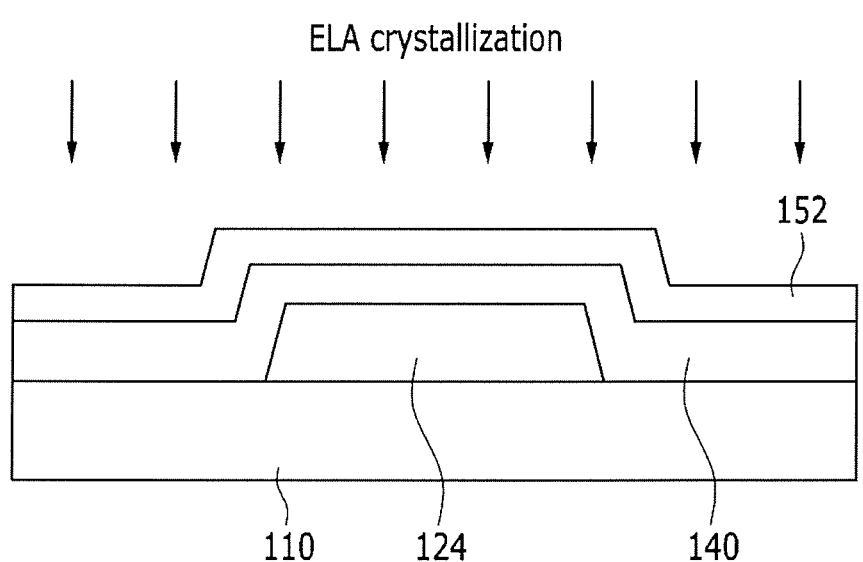
Figure 8:
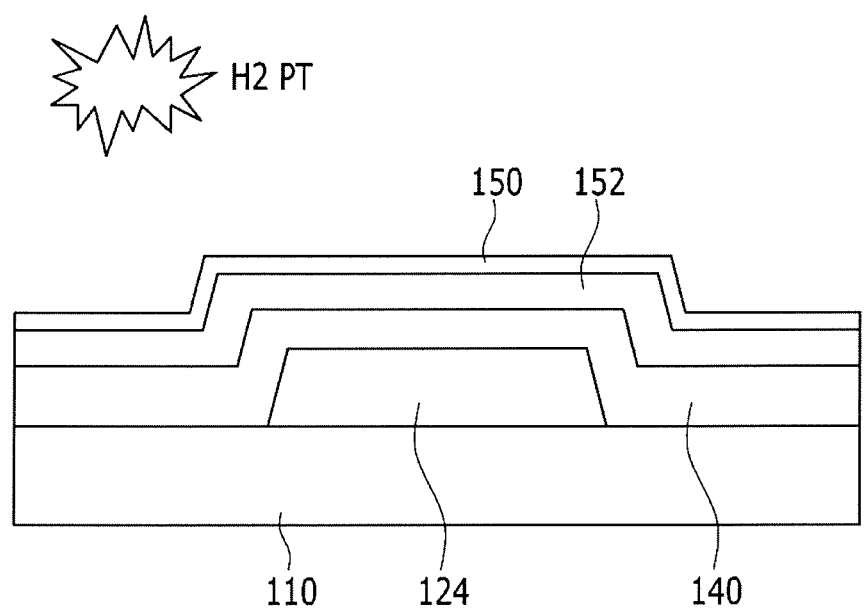
Figure 9:
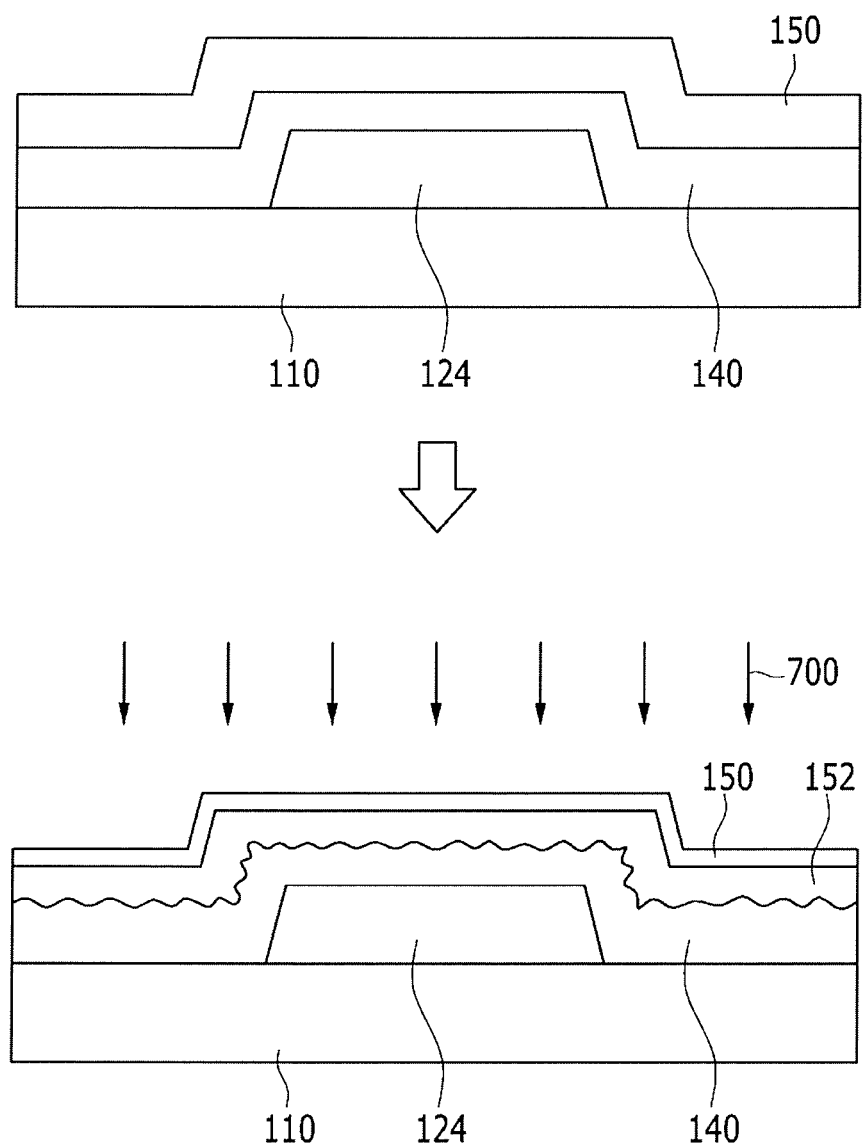
FIG. 9 illustrates a manufacturing method of a thin film transistor according to an exemplary embodiment of the present invention.

FIGS. 6 to 8 illustrate a manufacturing method of a thin film transistor according to the comparative example. FIG. 9 illustrates a manufacturing method of a thin film transistor according to an exemplary embodiment of the present invention. The manufacturing method of FIGS. 6 to 9 may be used to manufacture the thin film transistor described above with reference to FIG. 5.

A manufacturing method of a thin film transistor according to the comparative example will be described with reference to FIGS. 6 to 8. Referring to FIG. 6, after the gate electrode 124 and the gate insulating layer 140 are formed on the substrate 110, the amorphous silicon thin film 150 may be formed on the gate insulating layer 140.

Referring to FIG. 7, a laser beam may be irradiated on the amorphous silicon thin film 150 and the amorphous silicon thin film 150 may form the polycrystalline silicon thin film 152. The irradiated laser beam may have an energy density that melts and crystallizes substantially the entire amorphous silicon thin film 150 to form the polycrystalline silicon thin film 152. The energy density of the irradiated laser beam may be about 300 mj/cm$^2$ or more.

Referring to FIG. 8, after the polycrystalline silicon thin film 152 is surface-treated using hydrogen plasma to have a smooth surface, the amorphous silicon thin film 150 may be formed.

The manufacturing method of the thin film transistor according to the comparative example illustrated in FIGS. 6 to 8 may include a first step of depositing the amorphous silicon thin film; a second step of crystallizing the amorphous silicon thin film as the polycrystalline silicon thin film by irradiating a laser; a third step of surface-treating the polycrystalline silicon thin film; and a forth step of forming the amorphous silicon thin film on the polycrystalline silicon thin film.

FIG. 9 illustrates a manufacturing method of a thin film transistor according to an exemplary embodiment of the present invention. Referring to FIG. 9, after the gate electrode 124 and the gate insulating layer 140 are formed on the substrate 110, the amorphous silicon thin film 150 may be formed on the gate insulating layer 140. The laser beam 700 may be irradiated on the amorphous silicon thin film 150 and some of the amorphous silicon thin film 150 may be transformed into the polycrystalline silicon thin film 152. Thus, the thin film transistor including the amorphous silicon thin film 150 and the polycrystalline silicon thin film 152 may be manufactured without surface-processing the polycrystalline silicon thin film 152 and then forming the amorphous silicon thin film 150 on the polycrystalline silicon thin film 152.

The irradiated laser beam 700 in the manufacturing method according to an exemplary embodiment of the present invention may have relatively low energy density (e.g., energy density of from about 150 mj/cm$^2$ to about 250 mj/cm$^2$). Thus, the amorphous silicon thin film 150 might not be entirely crystallized, but may be partially crystallized.

In the manufacturing method according to an exemplary embodiment of the present invention, since the manufacturing process may be simplified, costs may be reduced. The amorphous silicon thin film layer 150 may be formed without performing an additional process, and thus interface adherence between the amorphous silicon thin film 150 and the polycrystalline silicon thin film 152 may be increased.

Referring to FIGS. 10 to 17, a thin film transistor array panel according to an exemplary embodiment of the present invention and a manufacturing method according to an exemplary embodiment of the present invention will be described below in more detail.

Figure 10:
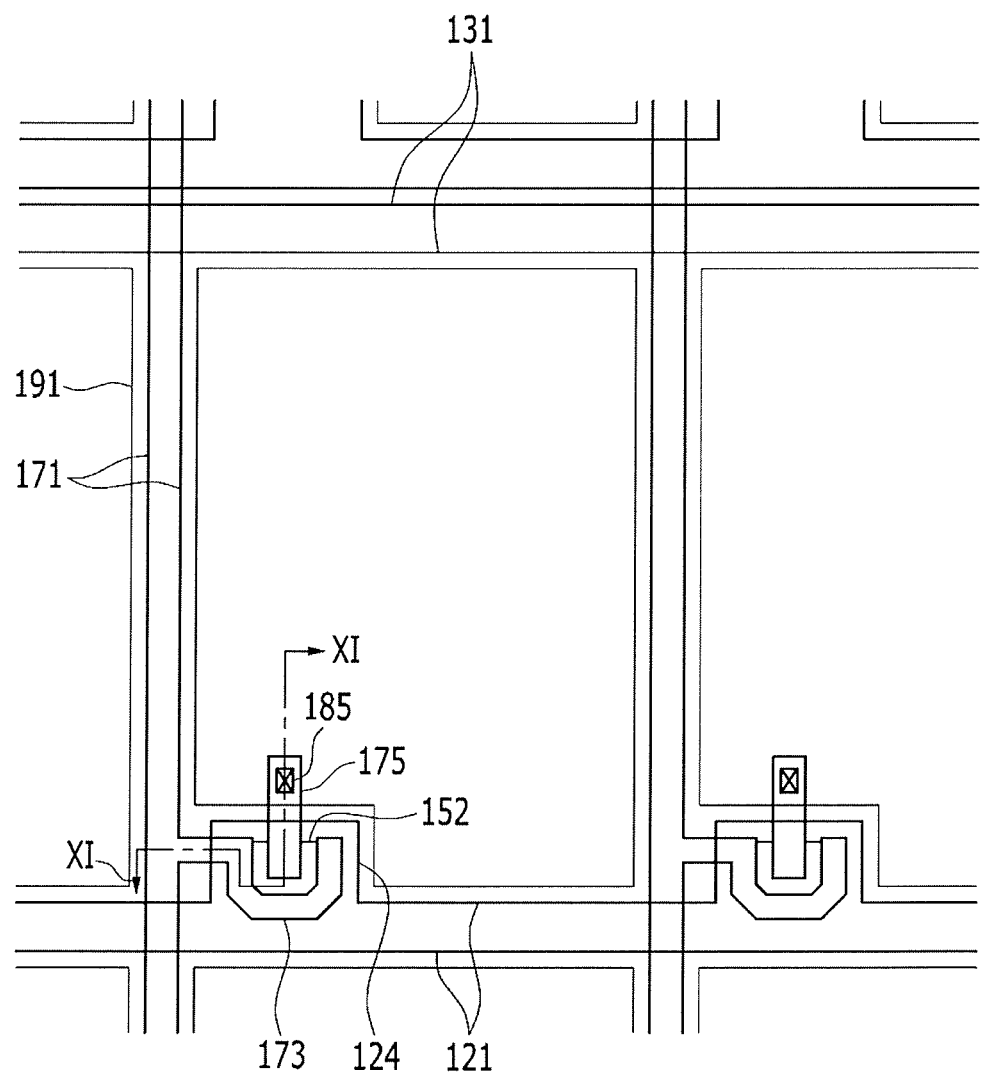
FIG. 10 is a top plan view of a thin film transistor array panel according to an exemplary embodiment of the present invention.
Figure 11:
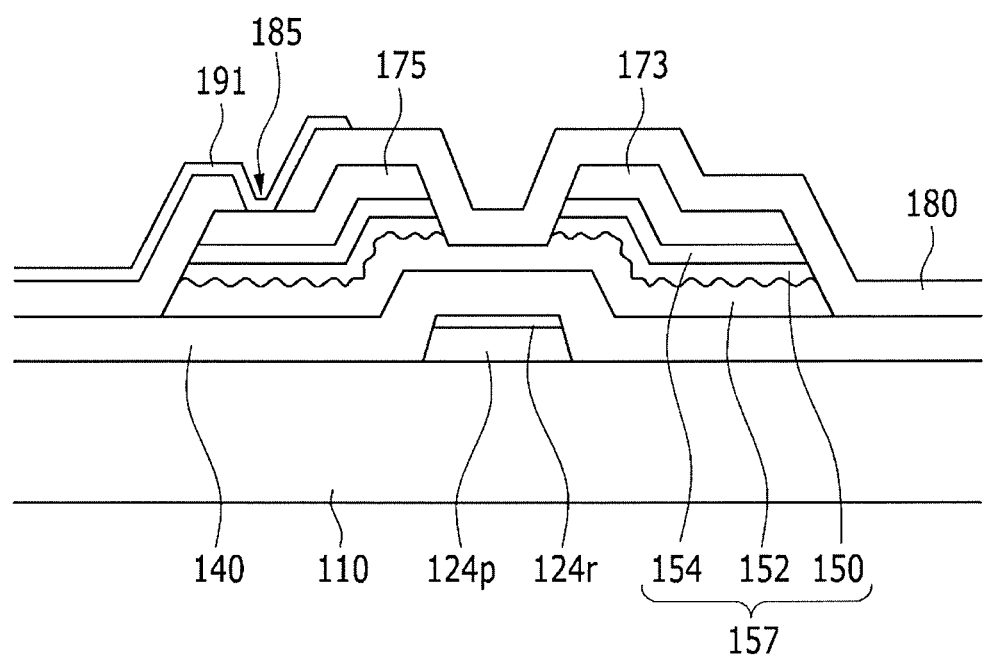
FIG. 11 is a cross-sectional view of FIG. 10 taken along the line XI-XI.

Referring to FIGS. 10 and 11, a thin film transistor array panel according to an exemplary embodiment of the present invention will be described in more detail below. FIG. 10 is a top plan view of a thin film transistor array panel according to an exemplary embodiment of the present invention. FIG. 11 is a cross-sectional view of FIG. 10 taken along the line XI-XI.

Referring to FIGS. 10 and 11, a thin film transistor array panel according to an exemplary embodiment of the present invention may include a plurality of gate lines 121 formed on the substrate 110, which may include transparent glass or plastic. The substrate 110 may be an insulation substrate.

The gate lines 121 may transmit a gate signal, and may extend in a horizontal direction. Each gate line 121 may include a plurality of gate electrodes 124 that protrude from the gate line 121.

The gate line 121 and the gate electrode 124 may have a dual layer structure including a first layer 124p and a second layer 124r. The first layer 124p and the second layer 124r may each include an aluminum-based metal such as aluminum (Al) or an aluminum alloy, a silver-based metal such as silver (Ag) or an silver alloy, a copper-based metal such as copper (Cu) or a copper alloy, a molybdenum-based metal such as molybdenum (Mo) or a molybdenum alloy, chromium (Cr), titanium (Ti), tantalum (Ta), or manganese (Mn). For example, the first layer 124p may include titanium, and the second layer 124r may include copper or a copper alloy.

In an exemplary embodiment of the present invention, the gate line 121 and the gate electrode 124 may include a dual layer, but exemplary embodiments of the present invention are not limited thereto. For example, the gate line 121 and the gate electrode may each include a single layer or a triple layer.

A storage electrode line 131 may be parallel to the gate line 121. The storage electrode line 131 may cross a pixel area and may be parallel to the gate line 121.

The storage electrode line 131 may have a dual layer structure including a first layer and a second layer.

The first and second layers of the storage electrode line 131 may each include an aluminum-based metal such as aluminum (Al) or an aluminum alloy, a silver-based metal such as silver (Ag) or an silver alloy, a copper-based metal such as copper (Cu) or a copper alloy, a molybdenum-based metal such as molybdenum (Mo) or a molybdenum alloy, chromium (Cr), titanium (Ti), tantalum (Ta), or manganese (Mn). For example, the first layer may include titanium, and the second layer may include copper or a copper alloy.

The storage electrode line 131 may be formed via the same process as the gate line 121, and the storage electrode line 131 and the gate line 121 may include a same material.

The gate insulating layer 140, which may include an insulating material such as a silicon oxide or a silicon nitride, may be formed on the gate line 121 and the storage electrode line 131. The gate insulating layer 140 may have a multilayer structure including at least two insulating layers having different physical properties.

The polycrystalline silicon thin film 152 may be formed on the gate insulating layer 140. The polycrystalline silicon thin film 152 may extend in a vertical direction, and may include a plurality of protruding portions that extend toward the gate electrode 124.

The amorphous silicon thin film 150 may be formed on the polycrystalline silicon thin film 152. In this case, an interface between the polycrystalline silicon thin film 152 and the amorphous silicon thin film 150 might not be smooth and thus the interface may include a plurality of protrusions and depressions. The plurality of protrusions and depressions may occur because the amorphous silicon thin film 150 is partially crystallized to form the polycrystalline silicon thin film 152 by laser irradiation instead of forming the polycrystalline silicon thin film 152 and then depositing the amorphous silicon thin film 150 on the polycrystalline silicon thin film 152.

The n+ silicon thin film 154 may be formed on the amorphous silicon thin film 150. The polycrystalline silicon thin film 152, the amorphous silicon thin film 150, and the n+ silicon thin film 154 may be collectively referred to as a semiconductor layer 157.

A plurality of data lines 171, a plurality of source electrodes 173, and a plurality of drain electrodes 175 that are connected to the data lines 171 may be formed on the semiconductor layer 157 and on the gate insulating layer 140.

The data line 171 may transmit a data signal, and may extend in the vertical direction to cross the gate line 121. The source electrode 173 may extend from the data line 171 to overlap the gate electrode 124, and may have a U-shape.

The drain electrode 175 may be separated from the data line 171, and may extend upward from a center of the U-shaped source electrode 173.

The semiconductor layer 157 may include a portion between the source electrode 173 and the drain electrode 175, which is not covered by the data line 171 and the drain electrode 175. The semiconductor layer 157 may have substantially the same planar shape as the data line 171 and the drain electrode 175 except for the exposed portion.

One gate electrode 124, one source electrode 173, and one drain electrode 175 may form one thin film transistor (TFT) along with the semiconductor layer 157. A channel region of the TFT may be formed on the polycrystalline silicon thin film 152 that is exposed between the source electrode 173 and the drain electrode 175.

A passivation layer 180 may be formed on the source electrode 173 and on the drain electrode 175. The passivation layer 180 may include an inorganic insulator such as a silicon nitride or a silicon oxide, an organic insulator, or a low dielectric constant insulator.

A plurality of contact holes 185 exposing one end of the drain electrode 175 may be formed in the passivation layer 180.

A plurality of pixel electrodes 191 may be formed on the passivation layer 180. The pixel electrodes 191 may each be physically and electrically connected to a respective one of the drain electrodes 175 via the contact hole 185, and may each receive a data voltage from the drain electrodes 175.

The pixel electrode 191 may include a transparent conductor such as ITO or IZO.

A manufacturing method of a thin film transistor array panel according to an exemplary embodiment of the present invention will now be described in more detail below with reference to FIG. 10 and FIGS. 12 to 17. FIGS. 12 to 17 are cross-sectional views of a manufacturing process of a thin film transistor array panel according to an exemplary embodiment of the present invention.

Figure 12:
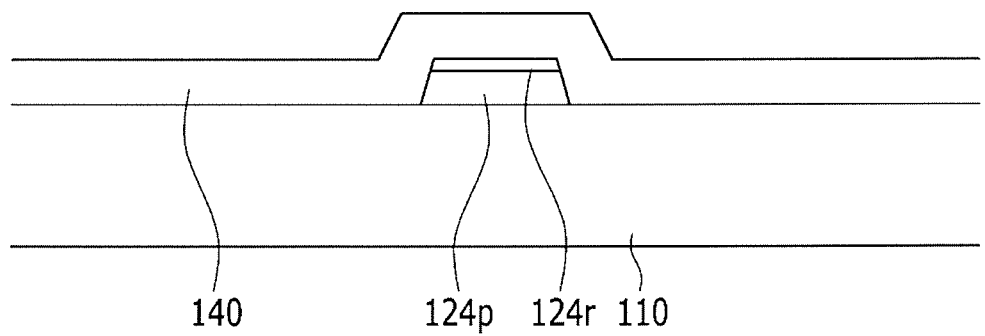
FIGS. 12 to 17 are cross-sectional views of a manufacturing process of a thin film transistor array panel according to an exemplary embodiment of the present invention.

Referring to FIGS. 10 and 12, the first layer 124p may include at least one of a molybdenum-based metal such as molybdenum (Mo) or a molybdenum alloy, chromium (Cr), a chromium alloy, titanium (Ti), a titanium alloy, tantalum (Ta), a tantalum alloy, manganese (Mn), and a manganese alloy and may be formed on an insulation substrate 110 that includes transparent glass or plastic. The second layer 124r may include one selected from an aluminum-based metal such as aluminum (Al) or an aluminum alloy, a silver-based metal such as silver (Ag) or an silver alloy, and a copper-based metal such as copper (Cu) or a copper alloy and may be formed on the on the first layer 124p, thus forming a dual layer. The dual layer may be patterned to form the gate line 121 including a gate electrode 124 and a storage electrode line.

A gate insulating layer 140 may be formed on the gate line 121, the gate electrode 124, and the storage electrode line 131.

Figure 13:
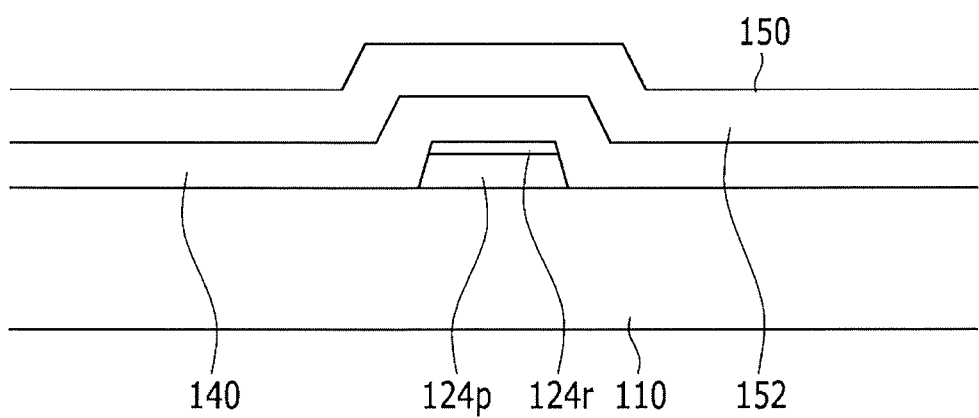

Referring to FIG. 13, the amorphous silicon thin film 150 may be formed on the gate insulating layer 140. The amorphous silicon thin film 150 may have a thickness of from about 35 nm to about 55 nm.

Figure 14:
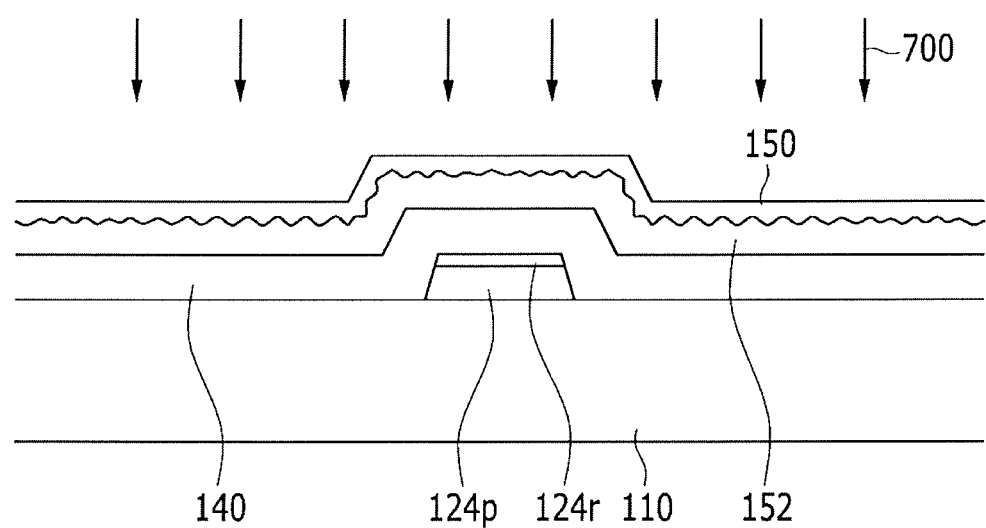

Referring to FIG. 14, the laser beam 700 may be irradiated to the amorphous silicon thin film 150 and the amorphous silicon thin film 150 may be partially crystallized to form the polycrystalline silicon thin film 152.

The laser beam 700 may have an energy density of from about 150 mj/cm$^2$ to about 250 mj/cm$^2$. The polycrystalline silicon thin film 152 may have a thickness of from about 25 nm to about 35 nm, and the residual amorphous silicon thin film 152, which is not crystallized to form the polycrystalline silicon thin film 150, may have a thickness of from about 10 nm to about 20 nm.

An interface between the amorphous silicon thin film 150 and the polycrystalline silicon thin film 152 might not be smooth and thus may include protrusions and depressions. This is because the amorphous silicon thin film 150 may be partially crystallized to form the polycrystalline silicon thin film 152 instead of forming the polycrystalline silicon thin film 152 and then depositing the amorphous silicon thin film 150 on the polycrystalline silicon thin film 152.

Figure 15:
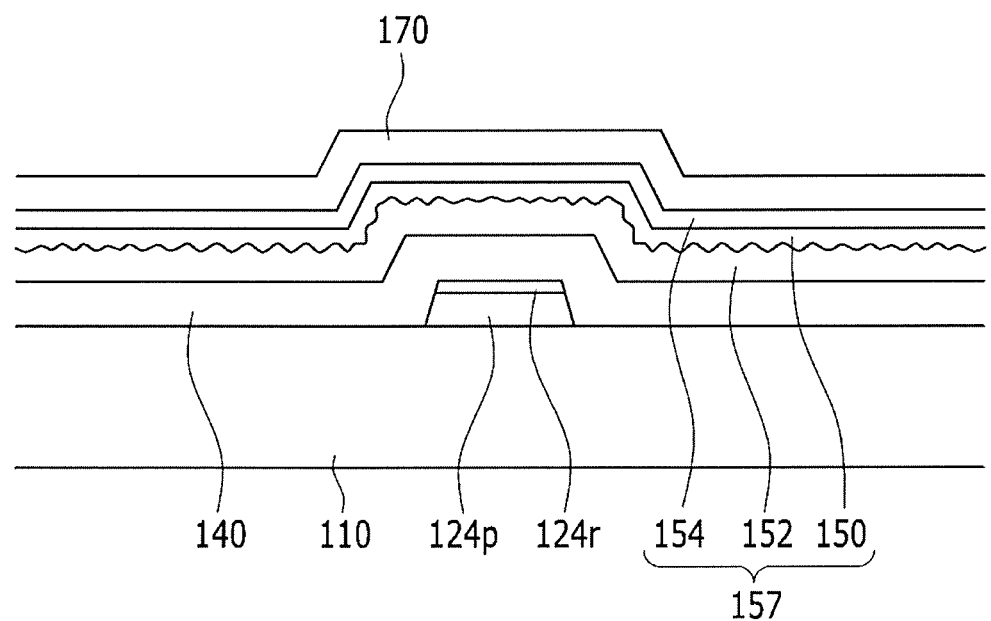

Referring to FIG. 15, the n+ silicon thin film 154 may be formed on the amorphous silicon thin film 150. A data conductive layer 170 may be formed on the n+ silicon thin film 154. The data conductive layer 170 may form the source electrodes 173 and the drain electrodes 175.

Figure 16:
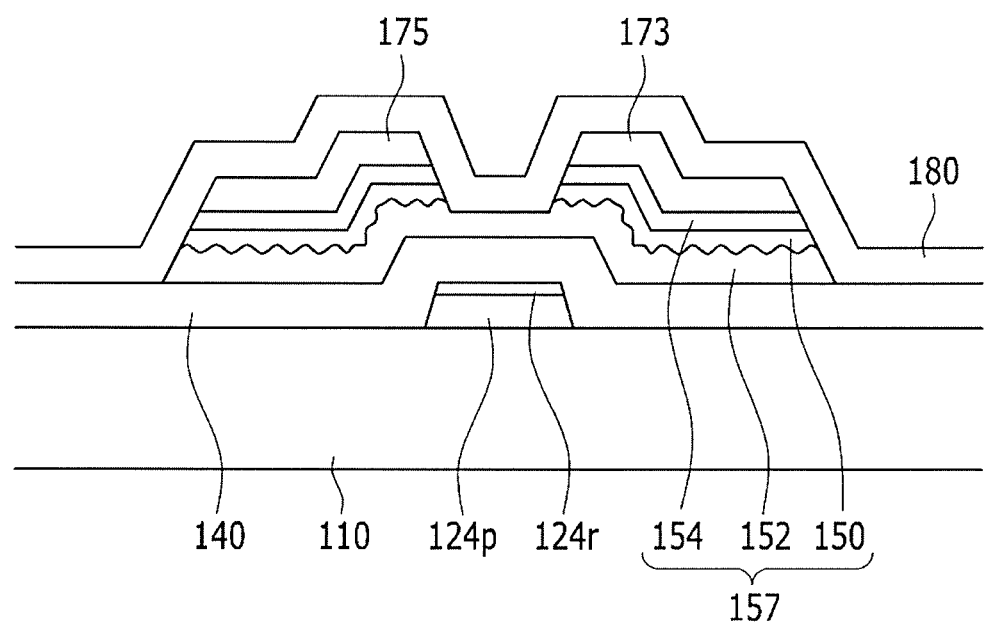

Referring to FIG. 16, the polycrystalline silicon thin film 152, the amorphous silicon thin film 150, the n+ silicon thin film 154, and the data conductive layer 170 may be patterned to form the source and drain electrodes 173 and 175, and the polycrystalline silicon thin film 152 may be exposed. The passivation layer 180 may be formed on the exposed polycrystalline silicon thin film 152, and on the source and drain electrodes 173 and 175.

Figure 17:
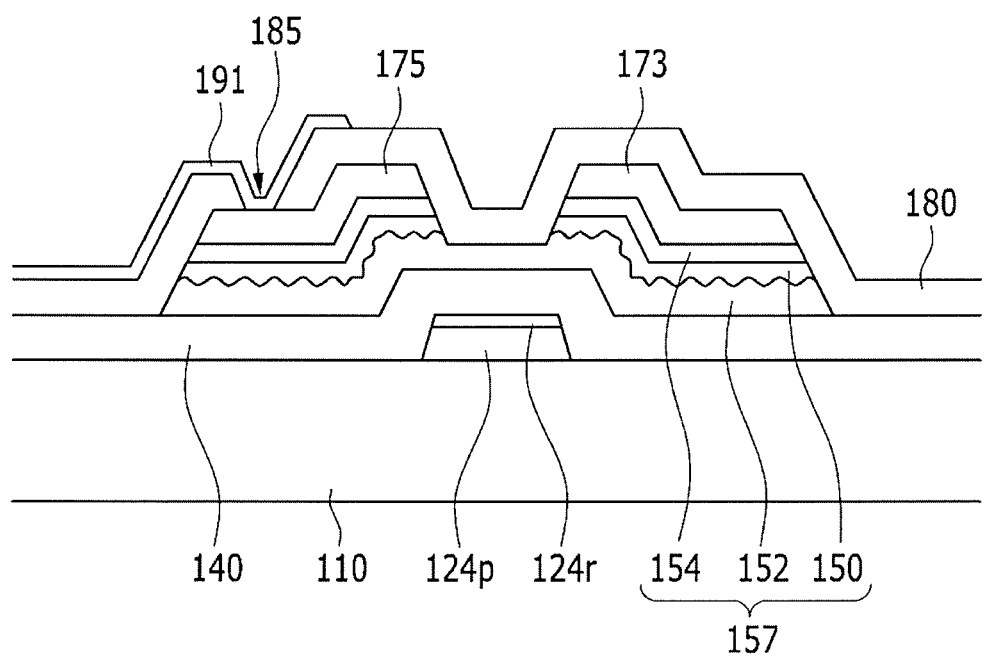

Referring to FIG. 17, the contact hole 185 may be formed in the passivation layer 180 to form the pixel electrode 191, which may be connected to the drain electrode 175.

In the manufacturing method of the silicon thin film and the manufacturing method of the thin film transistor array panel according to an exemplary embodiment of the present invention, the silicon thin film having the dual structure of the polycrystalline silicon thin film 152 and the amorphous silicon thin film 150 may be manufactured by irradiating a relatively low energy density laser beam at from about 150 mj/cm2 to about 250 mj/cm2 to the amorphous silicon thin film 150 such that the amorphous silicon thin film 150 is partially crystallized to form the polycrystalline silicon thin film 152 without performing an additional deposition process. Thus, manufacturing costs may be reduced by omitting an additional deposition process and a surface treatment process before the additional deposition process.

Figure 18:
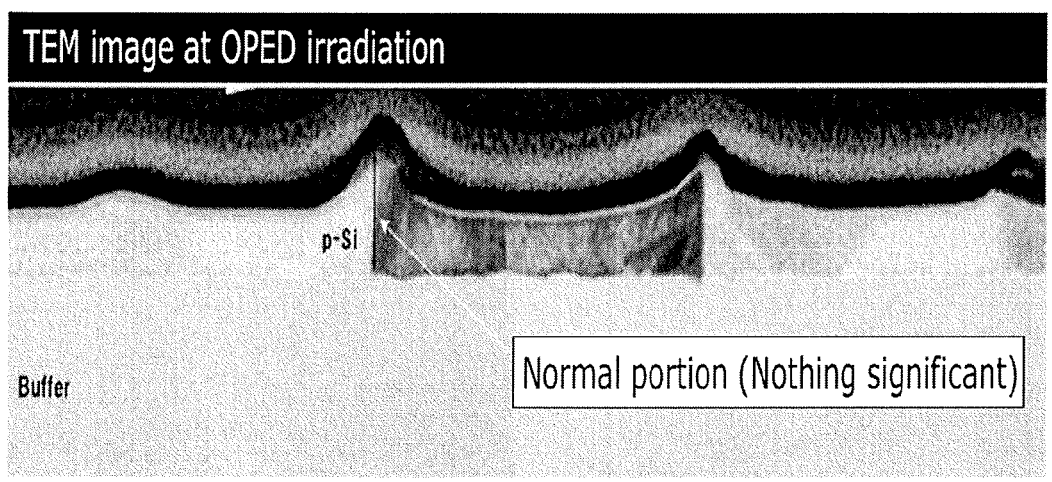
FIG. 18 illustrates a silicon thin film according to the comparative example.

FIG. 18 illustrates a silicon thin film according to the comparative example. Referring to FIG. 18, when light having an energy density of about 300 mj/cm$^2$ is irradiated to the amorphous silicon thin film, substantially the entire amorphous silicon thin film may be crystallized to form the polycrystalline silicon thin film.

Figure 19:
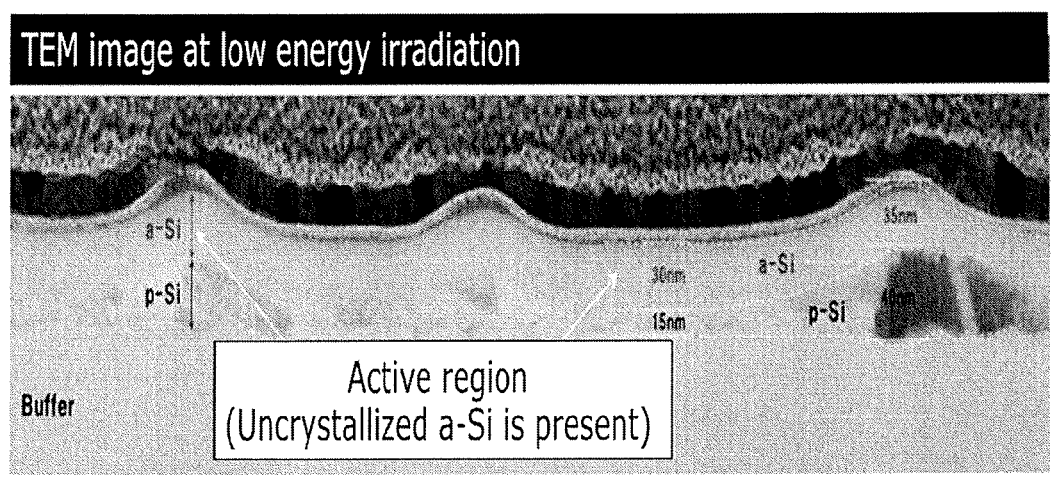
FIG. 19 illustrates a silicon thin film according to an exemplary embodiment of the present invention.

FIG. 19 illustrates a silicon thin film according to an exemplary embodiment of the present invention. Referring to FIG. 19, a lower part of the silicon thin film according to an exemplary embodiment of the present invention may be crystallized to form the polycrystalline silicon thin film, and the amorphous silicon thin film may be present in an upper part of the silicon thin film. A thickness of the polycrystalline silicon thin film may be about 30 nm, and a thickness of the amorphous silicon thin film may be about 15 nm. The thickness of the polycrystalline silicon thin film may be varied depending on an intensity of the irradiated light. The thickness of the polycrystalline silicon thin film may increase as an intensity of the irradiated light increases, and the thickness may decrease as an intensity of the irradiated light decreases.

In the thin film transistor including the silicon thin film layer having a dual structure including the polycrystalline silicon thin film 152 and the amorphous silicon thin film 150, a leakage current may be reduced or eliminated.

Figure 20:
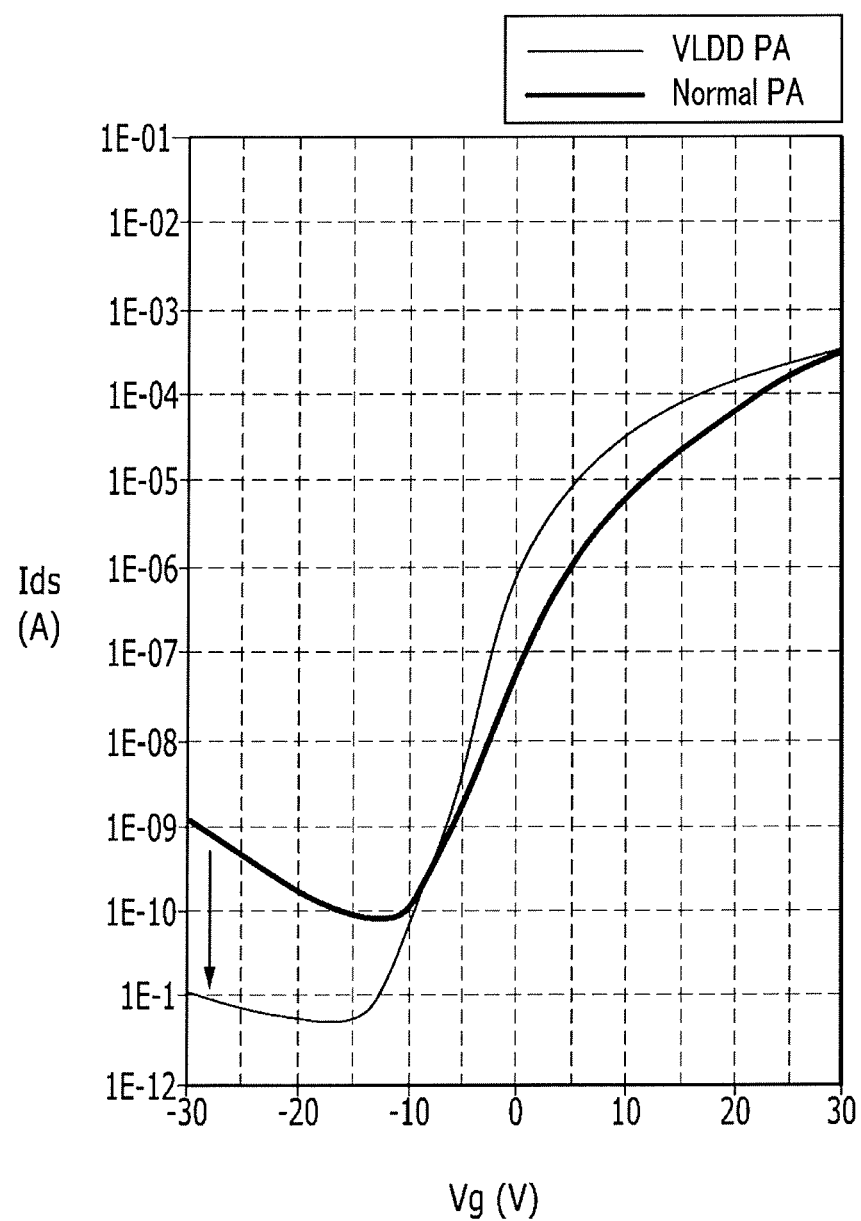

FIGS. 20 and 21 show exemplary results of TFT characteristics of the thin film transistor according to the comparative example and the thin film transistor according to an exemplary embodiment of the present invention. Referring to FIG. 20, after comparing the thin film transistor according to the comparative example (normal PA) with the thin film transistor according to the an exemplary embodiment of the present invention (VLDD PA), it can be seen that the graph of the thin film transistor according to an exemplary embodiment of the present invention generally shows a relatively lower amount of current. Referring to FIG. 21, in the thin film transistor array panel according to an exemplary embodiment of the present invention in which the amorphous silicon thin film is formed on the polycrystalline silicon thin film, it can be seen that the leakage current may be reduced. Referring to FIG. 21, it can be seen that an off-current (Ioff) of the thin film transistor according to an exemplary embodiment of the present invention (VLDD PA) may be significantly decreased compared with an off-current of the thin film transistor according to the comparative example of the present invention (normal PA). Thus, in the thin film transistor array panel according to an exemplary embodiment of the present invention, the leakage current may be reduced and thus the transistor characteristics can be increased by positioning the amorphous silicon thin film on the polycrystalline silicon thin film.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A manufacturing method of a thin film transistor array panel, comprising:
    forming an amorphous silicon thin film on a substrate; and
    crystallizing a lower region of the amorphous silicon thin film to form a polycrystalline silicon thin film by irradiating a laser beam with an energy density of from about 150 mj/cm$^2$ to about 250 mj/cm$^2$ to the amorphous silicon thin film,
    wherein a thickness of an uncrystallized part of the amorphous silicon thin film is from about 10 nm to about 20 nm after crystallizing the lower region of the amorphous silicon thin film to form the polycrystalline silicon thin film.

2. The manufacturing method of claim 1, wherein a thickness of the amorphous silicon thin film is from about 35 nm to about 55 nm.

3. The manufacturing method of claim 2, wherein a thickness of the crystallized polycrystalline silicon thin film is from about 25 nm to about 35 nm.

4. The manufacturing method of claim 2, wherein a ratio of the thickness of the polycrystalline silicon thin film to the thickness of the uncrystallized amorphous silicon thin film is about 2:1.

5. The manufacturing method of claim 1, wherein the laser beam is irradiated to an upper region of the amorphous silicon thin film.

6. The manufacturing method of claim 1, further comprising forming a gate insulating layer on the substrate before forming the amorphous silicon thin film on the substrate.

7. The manufacturing method of claim 6, further comprising forming source and drain electrodes on the amorphous silicon thin film.

8. The manufacturing method of claim 6, further comprising forming a gate line including a gate electrode on the substrate before forming the gate insulating layer.

9. A thin film transistor array panel, comprising:
    a gate insulating layer formed on a substrate;
    a polycrystalline silicon thin film formed on the gate insulating layer;
    an amorphous silicon thin film formed on the polycrystalline silicon thin film; and
    source and drain electrodes formed on the amorphous silicon thin film, wherein protrusions and depressions are formed on an interface between the polycrystalline silicon thin film and the amorphous silicon thin film.

10. The thin film transistor array panel of claim 9, wherein a ratio of a thickness of the polycrystalline silicon thin film to a thickness of the amorphous silicon thin film is about 2:1.

11. The thin film transistor array panel of claim 9, wherein a thickness of the polycrystalline silicon thin film is from about 25 nm to about 35 nm.

12. The thin film transistor array panel of claim 11, wherein a thickness of the amorphous silicon thin film is from about 10 nm to about 20 nm.

13. The thin film transistor array panel of claim 9, further comprising an n+ silicon thin film formed between the amorphous silicon thin film and the source and drain electrodes.

14. The thin film transistor array panel of claim 9, comprising a pixel electrode connected to the drain electrode.

15. A thin film transistor array panel, comprising:
a gate line formed on a substrate
a gate insulating layer formed the substrate, wherein the gate insulating layer covers the gate line;
a polycrystalline silicon thin film formed on the gate insulating layer;
an amorphous silicon thin film formed on the polycrystalline silicon thin film, wherein the polycrystalline silicon thin film comprises protrusions and depressions formed on an interface between the polycrystalline silicon thin film and the amorphous silicon thin film;
source and drain electrodes formed on the amorphous silicon thin film; and
a passivation layer formed on the source and drain electrodes.

16. The thin film transistor array panel of claim 15, wherein the gate line has a dual layer structure comprising a first layer disposed on the substrate and a second layer disposed on the first layer.

17. The thin film transistor of claim 16, wherein the first and second layers each comprise at least one of an aluminum-based metal such as aluminum (Al) or an aluminum alloy, a silver-based metal such as silver (Ag) or an silver alloy, a copper-based metal such as copper (Cu) or a copper alloy, a molybdenum-based metal such as molybdenum (Mo) or a molybdenum alloy, chromium (Cr), titanium (Ti), tantalum (Ta), or manganese (Mn).

18. The thin film transistor of claim 16, wherein the first layer includes titanium and the second layer includes copper or a copper alloy.

19. The thin film transistor of claim 15, wherein a thickness of the amorphous silicon thin film is from about 35 nm to about 55 nm, and wherein a thickness of the crystallized polycrystalline silicon thin film is from about 25 nm to about 35 nm.

* * * * *